United States Patent
Bramanti et al.

(10) Patent No.: US 10,985,269 B2
(45) Date of Patent: Apr. 20, 2021

(54) TWO-DIMENSIONAL ELECTRON GAS (2DEG)-CONFINED DEVICES AND METHODS

(71) Applicant: STMicroelectronics S.r.l., Agrate Brianza (IT)

(72) Inventors: Alessandro Paolo Bramanti, Maglie (IT); Alberto Pagani, Nova Milanese (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 24 days.

(21) Appl. No.: 16/376,468

(22) Filed: Apr. 5, 2019

(65) Prior Publication Data
US 2020/0321456 A1    Oct. 8, 2020

(51) Int. Cl.
| | |
|---|---|
| H01L 29/778 | (2006.01) |
| H01L 29/10 | (2006.01) |
| H01L 29/40 | (2006.01) |
| H01L 29/417 | (2006.01) |
| H01L 29/423 | (2006.01) |
| H01L 29/66 | (2006.01) |
| H03K 17/687 | (2006.01) |

(Continued)

(52) U.S. Cl.
CPC ........ *H01L 29/778* (2013.01); *H01L 21/0254* (2013.01); *H01L 21/02546* (2013.01); *H01L 27/0605* (2013.01); *H01L 27/0629* (2013.01); *H01L 29/1029* (2013.01); *H01L 29/2003* (2013.01); *H01L 29/205* (2013.01); *H01L 29/402* (2013.01); *H01L 29/41758* (2013.01); *H01L 29/42316* (2013.01); *H01L 29/66462* (2013.01); *H03K 17/687* (2013.01)

(58) Field of Classification Search
None
See application file for complete search history.

(56) References Cited

U.S. PATENT DOCUMENTS

| 8,803,340 B2 | 8/2014 | Moddel |
| 2008/0105902 A1 | 5/2008 | Twynam |

(Continued)

FOREIGN PATENT DOCUMENTS

CN    103872145 A    6/2014

OTHER PUBLICATIONS

Fukai et al., "Reflection and refraction of ballistic electrons through different carrier concentration regions," *Appl. Phys. Lett.* 60(1):105-108, Jan. 1992.

(Continued)

*Primary Examiner* — Jack S Chen
(74) *Attorney, Agent, or Firm* — Seed Intellectual Property Law Group LLP (57) ABSTRACT

Embodiments are directed to two-dimensional electron gas (2DEG)-confined 2DEG devices and methods. One such device includes a substrate and a heterostructure on the substrate. The heterostructure includes a first semiconductor layer, a second semiconductor layer, and a 2DEG layer between the first and second semiconductor layers. The device further includes a 2DEG device having a conduction channel in the 2DEG layer. An isolation electrode overlies the heterostructure and at least partially surrounds a periphery of the 2DEG device. The isolation electrode, in use, interrupts the 2DEG layer in response to an applied voltage.

14 Claims, 4 Drawing Sheets

(51) Int. Cl.
*H01L 29/205* (2006.01)
*H01L 29/20* (2006.01)
*H01L 21/02* (2006.01)
*H01L 27/06* (2006.01)

(56) References Cited

U.S. PATENT DOCUMENTS

2020/0321456 A1* 10/2020 Bramanti .............. H01L 21/765
2020/0321457 A1* 10/2020 Bramanti .............. H01L 29/205

OTHER PUBLICATIONS

Schäpers et al., "Reflection and Transmission of Ballistic Electrons at a Potential Barrier," *Superlattices and Microstructures* 14(1):57-63, 1993.

* cited by examiner

TWO-DIMENSIONAL ELECTRON GAS (2DEG)-CONFINED DEVICES AND METHODS

BACKGROUND

Technical Field

The present disclosure generally relates to high electron mobility transistor devices and methods, and more specifically to electrical isolation for high electron mobility transistors.

Description of the Related Art

A high electron mobility transistor (HEMT) is a type of field effect transistor (FET) in which an electron current flows freely within a conduction channel in a semiconductor. Such a substantially unobstructed conduction channel forms in a two-dimensional electron gas (2DEG) layer adjacent to a heterojunction, i.e., a boundary between two different semiconductors.

In conventional HEMTs, neighboring HEMTs may share a common 2DEG layer. This can lead to communication or crosstalk through the 2DEG layer between the neighboring HEMTs. In some cases, such communication between neighboring HEMTs may not present a problem, and may even be desirable, for example, when the neighboring HEMTs need to communicate. In other cases, however, unwanted communication between neighboring HEMTs may result due to the shared 2DEG layer. To electrically isolate the neighboring HEMTs from one another, an isolation trench may be physically formed through the heterojunction to create a physical boundary through the 2DEG layer between the neighboring HEMTs.

BRIEF SUMMARY

The present disclosure is generally directed to devices, systems, and methods in which an isolation electrode is provided to electrically confine or isolate a 2DEG device for example: a high electron mobility transistor (HEMT), a 2DEG diode, a 2DEG resistor, or the like. The isolation electrode at least partially surrounds a periphery of the 2DEG device and overlies a heterostructure including a 2DEG layer. In response to applying a voltage to the isolation electrode, the isolation electrode generates a space charge region which interrupts the underlying 2DEG layer, thereby electrically isolating the HEMT from one or more neighboring HEMTs.

In one or more embodiments, the present disclosure provides a device that includes a substrate, and a heterostructure on the substrate. The heterostructure includes a first semiconductor layer on the substrate, a second semiconductor layer on the first semiconductor layer, and a two-dimensional electrode gas (2DEG) layer between the first and second semiconductor layers. The device further includes a 2DEG device having a conduction channel in the 2DEG layer, and an isolation electrode. The isolation electrode overlies the heterostructure and at least partially surrounds a periphery of the 2DEG device. In use, the isolation electrode interrupts the 2DEG layer in response to an applied voltage.

In one or more embodiments, the present disclosure provides a device that includes a substrate and a heterostructure on the substrate. The heterostructure includes a first semiconductor layer on the substrate, a second semiconductor layer on the first semiconductor layer, and a two-dimensional electrode gas (2DEG) layer between the first and second semiconductor layers. A first 2DEG device subnet is on the heterostructure, and the first 2DEG device subnet includes a first plurality of 2DEG devices, which may be, for example, HEMTs. A second 2DEG device subnet is on the heterostructure, and the second 2DEG device subnet includes a second plurality of 2DEG devices (such as, for example, HEMTs) and is positioned adjacent to the first 2DEG device subnet. A first isolation electrode is on the heterostructure and is positioned between the first 2DEG device subnet and the second 2DEG device subnet.

In one or more embodiments, the present disclosure provides a method that includes: forming a heterostructure on a substrate, the heterostructure including a first semiconductor layer on the substrate, a second semiconductor layer on the first semiconductor layer, and a two-dimensional electrode gas (2DEG) layer between the first and second semiconductor layers; forming source and drain contacts of a high electron mobility transistor (HEMT) on the heterostructure; forming a gate of the HEMT on the heterostructure; and forming an isolation electrode on the heterostructure and at least partially surrounding a periphery of the HEMT.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with high electron mobility transistors (HEMTs) have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the Disclosure provided herein are for convenience only and do not interpret the scope or meaning of the embodiments.

Throughout the specification, the term "layer" is used in its broadest sense to include a thin film, a cap, or the like. The term "compound semiconductor" generally includes any semiconductor compound that includes chemical elements of at least two different species, and has one or more materials outside column IV of the periodic table of the elements (e.g., carbon, silicon, germanium, etc.). The term "high-frequency" in the context of operating wireless communication devices, is meant in a relative sense, and is not limited to a designated frequency range (e.g., a particular "HF band" within the range of 3-30 MHz).

Reference throughout the specification to conventional deposition techniques for depositing metals, polysilicon, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film or layer in-situ.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of polysilicon, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable.

Specific embodiments are described herein with reference to 2DEG devices, for example: an HEMT device, a 2DEG diode, 2DEG resistor, or the like; however, the present disclosure and the reference to certain materials, dimensions, and the details and ordering of processing steps are exemplary and embodiments of the present disclosure are not be limited to those shown.

Figure 1A:
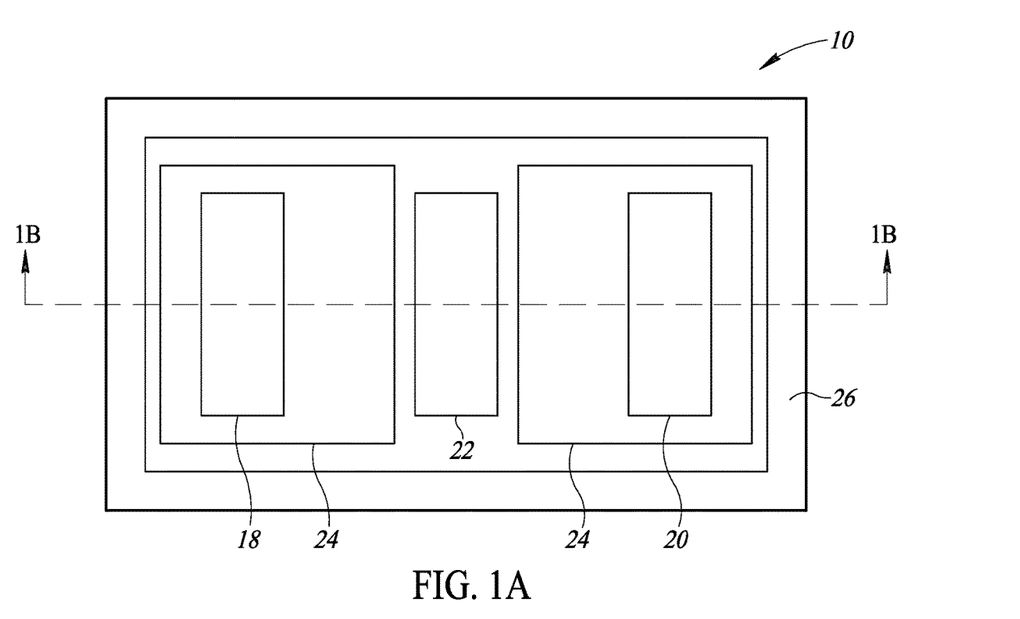
FIG. 1A is a top plan view illustrating a two-dimensional electron gas (2DEG)-confined device, which may be a high electron mobility transistor (HEMT) device, in accordance with one or more embodiments of the present disclosure.
Figure 1B:
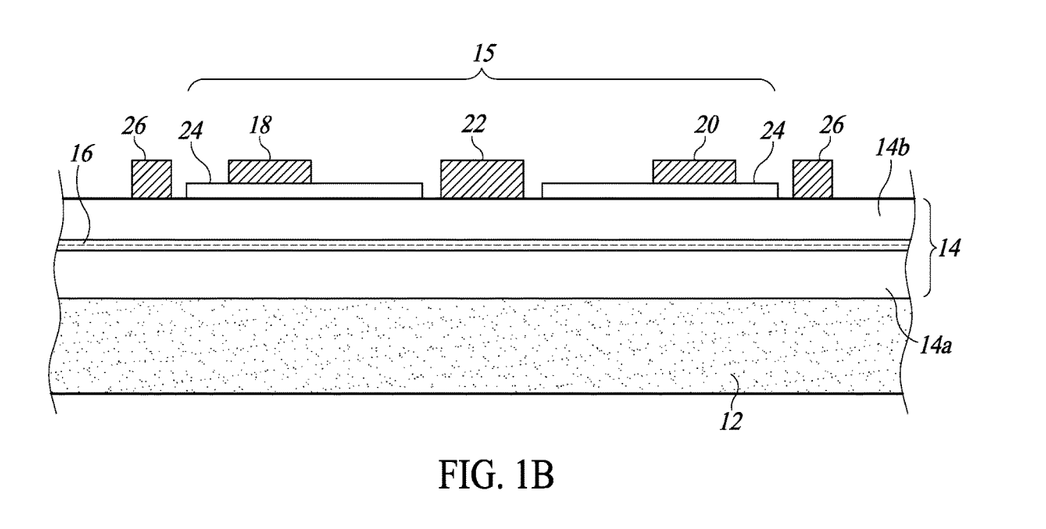
FIG. 1B is a cross-sectional view of the HEMT device shown in FIG. 1A, in accordance with one or more embodiments of the present disclosure.

FIG. 1A is a top plan view illustrating a two-dimensional electron gas (2DEG)-confined device 10, which in some embodiments may be a high electron mobility transistor (HEMT) device, and FIG. 1B is a cross-sectional view of the device 10, in accordance with one or more embodiments of the present disclosure.

The device 10 includes a 2DEG device 15 and an isolation electrode 26 at least partially surrounding the 2DEG device 15. In the following description, the device 10 will be described as a HEMT device 10, which includes a high electron mobility transistor (HEMT) 15. However, it will be readily appreciated that in various embodiments, any other 2DEG device which utilizes a 2DEG layer for conduction may be included in addition to or in place of the HEMT 15, and may be at least partially surrounded by the isolation electrode 26.

The HEMT device 10 includes a substrate 12 and a heterostructure 14 on the substrate 12, and the HEMT 15 and the isolation electrode 26 are formed on the substrate 12 and the heterostructure 14. The substrate 12 may be any semiconductor substrate, and may include, for example, silicon (Si), silicon carbide (SiC), aluminum oxide ($Al_2O_3$) or any other suitable substrate. In some embodiments, the substrate 12 may be or include semi-insulating gallium arsenide (GaAs).

The heterostructure 14 may be a stack of materials which may form a uniform two-dimensional electron gas (2DEG) layer 16 therein. A two-layered heterostructure 14 including two different semiconductor materials, a first layer 14a and a second layer 14b, is shown in FIG. 1B and described herein; however, embodiments of the present disclosure are not limited thereto. In various embodiments, the HEMT device 10 may include heterostructures having more than two layers, including, for example, structures wherein each of the first layer 14a and the second layer 14b may include one or more semiconductors.

The HEMT 15 includes source and drain contacts 18 and 20, respectively, and a gate 22 formed on the second layer 14b of the heterostructure 14. The gate 22 modulates electron mobility within a conduction channel 114.

Formation of the 2DEG layer 16 at the heterojunction between the first and second layers 14a, 14b is related to energy levels within the heterostructure 14. In some embodiments, the semiconductor material in the second layer 14b of the heterostructure 14 is a doped semiconductor material having a wide energy band gap. For example, the second layer 14b may be or include a layer of a negatively-doped semiconductor, e.g., negatively-doped (e.g., doped with n-type dopants) aluminum gallium arsenide ($Al_xGa_{1-x}As$) or negatively-doped gallium nitride (GaN).

The semiconductor material in the first layer 14a of the heterostructure 14 may be an un-doped or intrinsic semiconductor material having a narrow energy band gap. In some embodiments, the first layer 14a may be or include a layer of an intrinsic semiconductor, e.g., undoped gallium arsenide (GaAs) or gallium nitride (GaN).

The term "band gap" refers to the difference between the energy of conduction band electrons (free electrons) and the energy of valence band electrons (atomically bound electrons), i.e., the amount of energy needed to liberate valence electrons from atoms in the semiconductor crystal. Because the band gaps differ between the first and second layers 14a, 14b of the heterostructure 14, the conduction band energies of the materials do not coincide. Thus, when two such layers of semiconductor materials are placed in contact with one another, their energy levels are discontinuous at the boundary or heterojunction. Such a discontinuity gives rise to a potential well at the heterojunction which traps unbound donor electrons from the n-doped material (e.g., the second layer 14b) at the surface of the un-doped material (e.g., the first layer 14a), resulting in a peak electron concentration at the heterojunction. Such trapped donor electrons are sometimes referred to as a two-dimensional electron gas (2DEG). The location of the 2DEG layer 16 thus defines the conduction channel of the HEMT 15.

Source and drain regions at either end of the conduction channel 114 can be negatively doped or un-doped, depending on the device.

Because the electrons in the conduction channel of the 2DEG layer 16 have little interaction with lattice, the mobility is high compared to the electron mobility in conventional transistor devices. The high electron mobility of the HEMT 15 allows a large electron current to flow within the conduction channel (i.e., the 2DEG layer 16), thereby increasing the speed of the device. A voltage applied to the gate 22 alters the conductivity within the conduction channel, thereby modulating the electron current between the source and drain contacts 18, 20. The ability to support such a high electron current makes HEMT devices suitable for high-power, high-frequency applications such as chips used in RF communication devices (e.g., cell phones, satellite TV receivers, radar equipment, and the like). Semiconductor materials typically used in HEMT devices include compound semiconductors that have high intrinsic electron mobility, such as, for example, gallium arsenide (GaAs), aluminum gallium arsenide (AlGaAs), gallium nitride (GaN), and indium gallium nitride (InGaN), among others.

In some embodiments, the HEMT 15 may include a capping layer 24 between the second layer 14b of the heterostructure 14 and the source and drain contacts 18, 20. The capping layer 24 may be a layer of negatively-doped semiconductor material. In some embodiments, the capping layer 24 may be a negatively-doped layer of a same semiconductor material as the first layer 14a. For example, in embodiments in which the first layer 14a is a layer of undoped GaAs or undoped GaN, the capping layer 24 may be a layer of negative-doped GaAs or negatively-doped GaN, respectively.

The HEMT 15 may have various different structures or materials in various embodiments, and may include one or more additional features of conventional high electron mobility transistors. In some embodiments, the HEMT device 10 may include a buffer layer between the substrate 12 and the heterostructure 14.

The isolation electrode 26 at least partially laterally surrounds the HEMT 15, and is operable to electrically isolate the HEMT 15 by interrupting the 2DEG layer 16 in response to a voltage being applied to the isolation electrode 26.

In conventional HEMTs, the 2DEG layer is used as the active channel. Neighboring HEMTs may communicate through a common 2DEG layer, for example, where two or more neighboring HEMTs are formed over a same 2DEG layer. In some cases, such communication between neighboring HEMTs may not present a problem, and may even be desirable, for example, when the neighboring HEMTs need to communicate. In other cases, however, unwanted communication (e.g., cross-talk) between neighboring HEMTs may result due to the shared 2DEG layer. By applying a voltage to the isolation electrode 26, the isolation electrode 26 is operable to selectively electrically isolate the HEMT 15, which can interrupt the 2DEG layer 16 and thereby reduce or eliminate such cross-talk between neighboring HEMTs.

In some embodiments, the HEMT 15 may be replaced by any device that uses a 2DEG layer 16 as a conduction channel (which may be referred to herein generally as a "2DEG device"), including, for example, a 2DEG diode, a 2DEG resistor, or the like.

Figure 2:
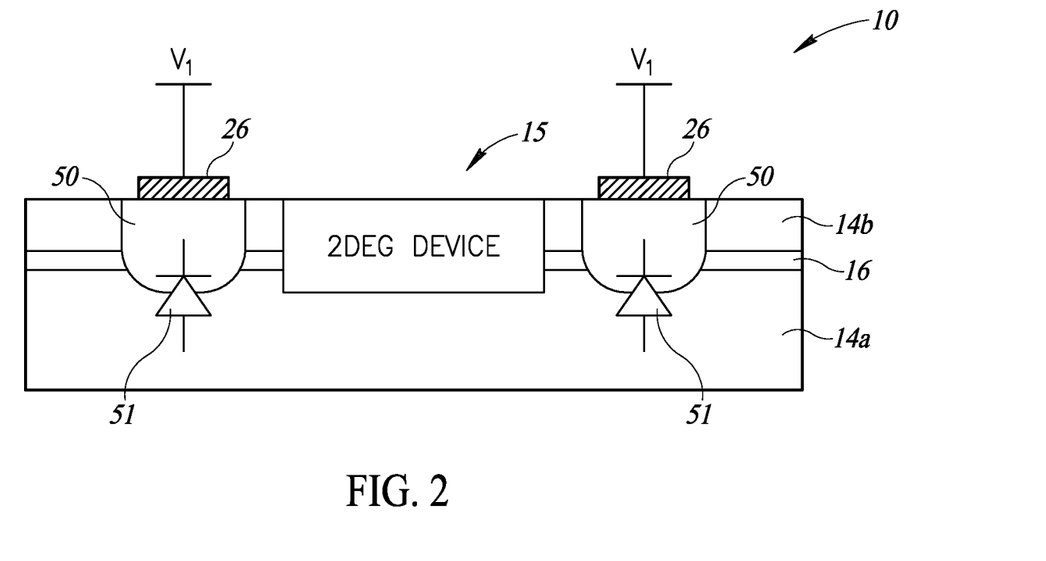
FIG. 2 is a cross-sectional view schematically illustrating interruption of the 2DEG layer in the 2DEG device shown in FIGS. 1A and 1B, in accordance with one or more embodiments of the present disclosure.

FIG. 2 is a cross-sectional view schematically illustrating interruption of the 2DEG layer 16 in the device 10 (which may be a HEMT device 10), and electrical isolation of the 2DEG device 15 (which may be a HEMT 15), by application of a suitable voltage to the isolation electrode 26. The HEMT 15 may be any high electron mobility transistor, including, for example, the HEMT 15 shown and described with respect to FIGS. 1A and 1B. It will be noted that FIG. 2 conceptually illustrates the HEMT 15, isolation electrode 26, first and second layers 14a, 14b of the heterostructure 14, and the 2DEG layer 16. It will be readily appreciated that other structures or features of the HEMT device 10 may be included, such as any structures or features shown and described with respect to FIGS. 1A and 1B.

As shown in FIG. 2, upon application of a voltage $V_1$ to the isolation electrode 26, space charge regions 50 are generated below the isolation electrode 26. The space charge regions 50 extend through the 2DEG layer 16, thereby interrupting the 2DEG layer 16 and electrically isolating the HEMT 15. For example, the HEMT 15 may be electrically isolated from one or more neighboring devices which share the 2DEG layer 16 when the voltage $V_1$ is applied to the isolation electrode 26. The space charge regions 50 interrupt or "pinch off" the active channel of the HEMT 15, thereby defining an isolation boundary at least partially surrounding the HEMT 15. The HEMT 15 may operate within the isolation boundary, e.g., with current flowing between the source and drain contacts 18, 20; however, the 2DEG layer 16 is interrupted such that the HEMT 15 is electrically isolated from neighboring devices.

The depth at which the space charge regions 50 extend beneath the isolation electrode 26 may depend on a magnitude of the voltage $V_1$ that is applied to the isolation electrode 26. The voltage $V_1$ applied to the isolation electrode 26 should therefore be sufficient to generate the space charge regions 50 with a depth which extends completely through the 2DEG layer 16. In some embodiments, the voltage $V_1$ may be sufficient to generate space charge regions 50 which extend at least partially through, or completely through, the 2DEG layer 16 and the first layer of the heterostructure 14.

It will be readily appreciated that in various embodiments, the HEMT device 10 may have various different sizes, dimensions, or geometries. For example, the thickness of the heterostructure 14, including thicknesses of the first and second layers 14a, 14b, as well as a thickness of the 2DEG layer 16, may vary depending, for example, on a particular design or application of the HEMT device 10. Accordingly, the magnitude of the voltage $V_1$ applied to the isolation electrode 26 which is sufficient to interrupt the 2DEG layer 16 may vary in various embodiments.

The space charge regions 50 may operate as, or otherwise form, diodes 51 between the first layer 14a and the second layer 14b of the heterostructure 14, which deplete the 2DEG layer 16 in the regions beneath the isolation electrode 26.

While the isolation electrode 26 is shown in FIG. 1A as being a single electrode which completely surrounds a periphery of the HEMT 15, in various embodiments, the isolation electrode 26 may have various different shapes or configurations. For example, in some embodiments, the isolation electrode 26 may be provided on the second layer 14b of the heterostructure 14 adjacent to one side of the HEMT 15, such as adjacent to the source contact 18 or the drain contact 20 as shown in FIG. 1B. In such a configuration, the HEMT 15 may be electrically isolated from one or more devices that are adjacent to one side of the HEMT 15, with the isolation electrode 26 disposed between the HEMT 15 and the neighboring devices.

In some embodiments, a plurality of isolation electrodes 26 may be provided on the second layer 14b of the heterostructure 14. For example, a first isolation electrode 26 may be adjacent to the source contact 18 along one side of the HEMT 15, and a second isolation electrode 26 may be adjacent to the drain contact 20 along a second side of the HEMT 15 that is opposite the first side. In this way, the 2DEG layer 16 may be interrupted along a channel direction (e.g., a direction between the source and drain contacts 18, 20) by application of suitable voltages to only two isolation electrodes 26 which do not completely surround the periphery of the HEMT 15, but instead are located on only two sides of the periphery of the HEMT 15. In some embodiments, only one isolation electrode 26 may be included, for example, along one side of the periphery of the HEMT 15. In such embodiments, the HEMT 15 may be isolated from one or more devices which are adjacent to the HEMT 15 but separated from the HEMT 15 by the isolation electrode 26.

While the isolation electrode 26 is shown in FIGS. 1A and 1B as having a straight or linear shape, embodiments of the present disclosure are not limited thereto. In various embodiments, the isolation electrode 26 may have any shape, including, for example, a curved shape, a wavy or undulating shape, a staircase shape, or any other shape which separates a periphery of the HEMT 15 from one or more neighboring devices.

The isolation electrode 26 may be made of any conductive material, including, for example, a metal material. In some embodiments, the isolation electrode 26 is made of polysilicon. In some embodiments, the isolation electrode 26 is made of a same material as that of the gate 22, and the gate 22 and the isolation electrode 26 may be formed in a same process, such as by a deposition process in which the isolation electrode 26 and the gate 22 are deposited on the second layer 14b of the heterostructure 14.

The gate 22 and the isolation electrode 26 may be formed on a same layer as one another, such as on a same surface of the second layer 14b of the heterostructure 14. In embodiments in which the HEMT device 10 includes the capping layer 24, the gate 22 may be a recessed gate which is recessed with respect to the source and drain contacts 18, 20, which may reduce parasitic coupling between the gate 22 and the source and drain contacts 18, 20. For example, a recess or opening may be formed through the capping layer 24, and the gate 22 may be disposed in the recess, for example, directly on a surface of the heterostructure 14. Similarly, the isolation electrode 26 may be recessed with respect to the source and drain contacts 18, 20 as shown in FIG. 1B. The recessed isolation electrode 26 may provide a reduction in unwanted coupling (e.g., parasitic coupling) between the isolation electrode 26 and adjacent electrodes, such as the source and drain contacts 18, 20 of the HEMT 15 or electrodes of any neighboring devices.

Figure 3:
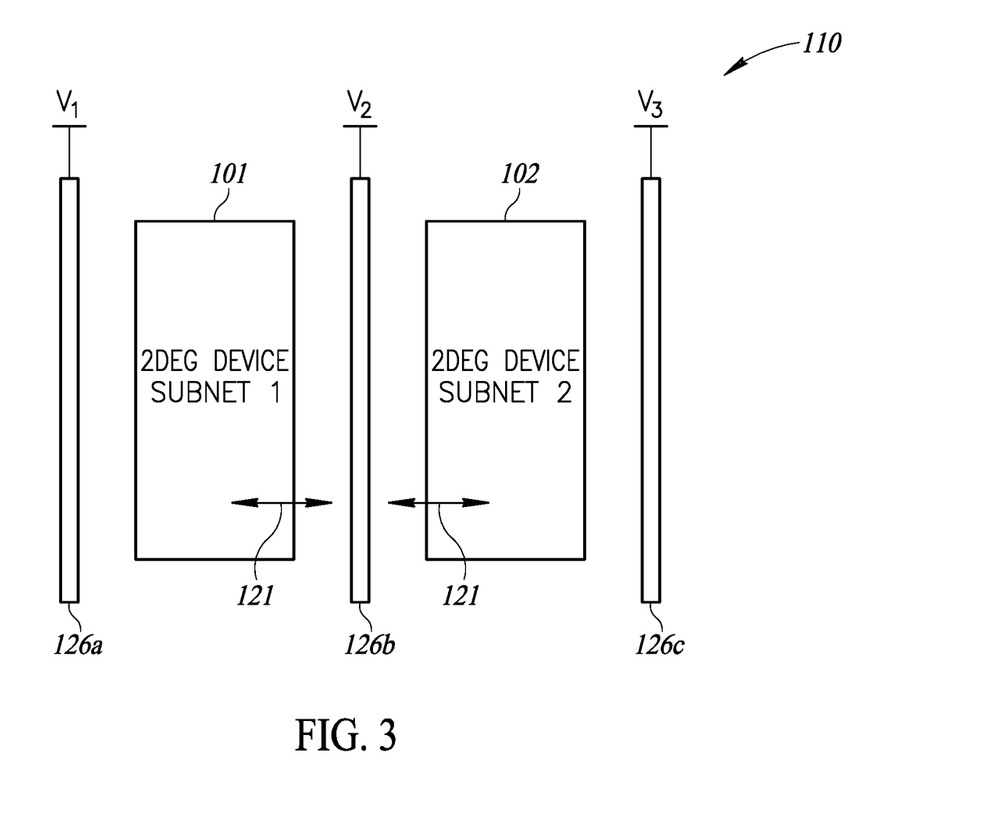
FIG. 3 is a top plan view schematically illustrating a device having a first 2DEG device subnet, a second 2DEG device subnet, and isolation electrodes, in accordance with one or more embodiments of the present disclosure.

FIG. 3 is a top plan view schematically illustrating a device 110, in accordance with one or more embodiments of the present disclosure. The device 110 includes a first 2DEG device subnet 101, a second 2DEG device subnet 102, and isolation electrodes 126a, 126b, 126c. In the following description, the first 2DEG device subnet 101 and the second 2DEG device subnet 102 will be described respectively as a first HEMT subnet 101 and a second HEMT subnet 102; however, it will be readily appreciated that in various embodiments, any 2DEG devices which utilize a 2DEG layer for conduction may be included within the first and second 2DEG device subnets 101, 102.

The device 110 may include a substrate and a heterostructure on the substrate, as shown, for example in FIG. 1B. The substrate and heterostructure may commonly extend beneath both the first and second HEMT subnets 101, 102. That is, the first and second HEMT subnets 101, 102 may share the same substrate and heterostructure.

Each of the first HEMT subnet 101 and the second HEMT subnet 102 may include a respective plurality of high electron mobility transistors (HEMTs). In some embodiments, the first and second HEMT subnets 101, 102 may include one or more additional semiconductor devices or circuit components. The plurality of HEMTs, as well as any additional semiconductor devices or circuit components, in the first and second HEMT subnets 101, 102 may be arranged in various circuit layouts, and may include one or more interconnections between the HEMTs or additional semiconductor devices or circuit components. Such interconnections may include, for example, metallization layers, vias, or the like, which electrically couple various HEMTs or additional semiconductor devices or circuit components in the first HEMT subnet 101 or in the second HEMT subnet 102.

First and second isolation electrodes 126a, 126b are disposed adjacent to first and second sides, respectively, of the first HEMT subnet 101. The second isolation electrode 126b and a third isolation electrode 126c are disposed adjacent to first and second sides, respectively, of the second HEMT subnet 102. The second isolation electrode 126b is positioned between the first HEMT subnet 101 and the second HEMT subnet 102.

The first, second, and third isolation electrodes 126a, 126b, 126c are operable to selectively electrically isolate the first and second HEMT subnets 101, 102 from one another, as well as from one or more neighboring devices or subnets. For example, upon application of suitable voltages to the first, second, and third isolation electrodes 126a, 126b, 126c, the 2DEG layer underlying the first HEMT subnet 101 may be interrupted or electrically isolated from the 2DEG layer underlying the second HEMT subnet 102.

In some embodiments, the first, second, and third isolation electrodes 126a, 126b, 126c are respectively coupled to first, second, and third supply voltages $V_1$, $V_2$, $V_3$. The first, second, and third isolation electrodes 126a, 126b, 126c may be independently controlled, for example, by selective application of the first, second, and third voltages $V_1$, $V_2$, $V_3$. For example, by applying the second voltage $V_2$ to the second isolation electrode 126b, the 2DEG layer underlying the first and second HEMT subnets 101, 102 may be interrupted, thereby electrically isolating the first and second HEMT subnets 101, 102 from one another. At the same time, the first and third supply voltages V1, $V_3$ may be decoupled (e.g., through one or more transistors or switching devices) from the first and third isolation electrodes 126a, 126c, so that the first and second HEMT subnets 101, 102 are not electrically isolated from neighboring devices across the first and third isolation electrodes 126a, 126c. This can result in power savings, for example, where electrical isolation is desirable only between the first and second HEMT subnets 101, 102.

In some embodiments, the first, second, and third supply voltages $V_1$, $V_2$, $V_3$ may be a same supply voltage that is commonly applied to each of the first, second, and third isolation electrodes 126a, 126b, 126c, so that each of the first, second, and third isolation electrodes 126a, 126b, 126c receives the same supply voltage at the same time.

In one embodiment the electric field generated by the electrodes is to deplete the 2DEG underneath, and the voltage should depend primarily on how the stack of materials is made.

In other embodiments, the first, second, and third supply voltages $V_1$, $V_2$, $V_3$ may be different supply voltages, each having a different voltage level. For example, the supply voltage applied to an isolation electrode positioned between or adjacent to one or more subnets (e.g., HEMT subnets having a large number of HEMT transistors) may be greater than the supply voltage applied to an isolation electrode positioned between or adjacent to other subnets. By applying a higher voltage to isolation electrodes between or adjacent to one or more subnets, the space charge region generated below the isolation electrode will extend to a greater depth to fully interrupt the 2DEG layer, which may further reduce the parasitic effects or parasitic capacitance between such subnets. Accordingly, the supply voltages applied to the isolation electrodes (e.g., the first, second, and third supply voltages $V_1$, $V_2$, $V_3$ respectively applied to the first, second, and third isolation electrodes 126a, 126b, 126c) may have various different voltage levels based on a size of the HEMT subnets or a number of devices within the HEMT subnets.

The first, second, and third supply voltages $V_1$, $V_2$, $V_3$ may be positive or negative voltages, depending for example on the particular design or desired operation of the HEMT transistors in the first and second HEMT subnets 101, 102. Additionally, the HEMT transistors in the first and second HEMT subnets 101, 102 may have various different sizes, dimensions, or geometries. Accordingly, the magnitude of the first, second, and third supply voltages $V_1$, $V_2$, $V_3$ respectively applied to the first, second, and third isolation electrodes 126a, 126b, 126c to sufficiently interrupt the 2DEG layer may vary in various embodiments.

The first, second, and third supply voltages $V_1$, $V_2$, $V_3$ may be provided by separate voltage supplies or voltage supply circuits, each of which may be selectively electrically coupled to a respect one of the first, second, and third isolation electrodes 126a, 126b, 126c, for example, via one or more transistors or switching devices. In some embodiments, processing circuitry such as a microcontroller or the like may be included in the device 110 and may control the selective application of the first, second, and third supply $V_1$, $V_2$, $V_3$ to the first, second, and third isolation electrodes 126a, 126b, 126c.

As shown in FIG. 3, the HEMTs adjacent to one or more sides of the first and second HEMT subnets 101, 102 may have channels which extend along a first direction 121 (e.g., the horizontal direction as shown in FIG. 3). That is, the channel direction or a direction between source and drain contacts through which current flows in the 2DEG layer of the HEMTs near the side boundary of the first and second HEMT subnets 101, 102 may extend along the first direction 121. In such embodiments, a generally linear or straight isolation electrode may be sufficient to interrupt the 2DEG layer and electrically isolate the first and second HEMT subnets 101, 102 from one another. For example, as shown in FIG. 3, the first, second, and third isolation electrodes 126a, 126b, 126c may have generally linear or straight shapes and may extend in a direction transverse (e.g., extending in the vertical direction as shown in FIG. 3) to the first direction 121. In some embodiments, the first, second, and third isolation electrodes 126a, 126b, 126c may be oriented perpendicular to the first direction 121.

While the isolation electrodes 126a, 126b, 126c are shown in FIG. 3 as having a straight or linear shape, embodiments of the present disclosure are not limited thereto. In various embodiments, the isolation electrodes 126a, 126b, 126c may have any shape, including, for example, a curved shape, a wavy or undulating shape, a staircase shape, or any other shape. In some embodiments, one or more isolation electrodes may completely surround a periphery or boundary of one or more of the HEMT subnets included in the device 110. Moreover, while the device 110 is shown in FIG. 3 as including two HEMT subnets and three isolation electrodes, in various embodiments, the device 110 may include any number of HEMT subnets and any number of isolation electrodes.

In some embodiments, each of the first and second HEMT subnets 101, 102 may include only a single HEMT, for example, with the second isolation electrode 126b positioned between the HEMTs of the first and second HEMT subnets 101, 102. In some embodiments, each of the first and second HEMT subnets 101, 102 may be 2DEG device subnets, as mentioned previously herein, each of which may include any 2DEG devices that use a 2DEG layer 16.

Figure 4:
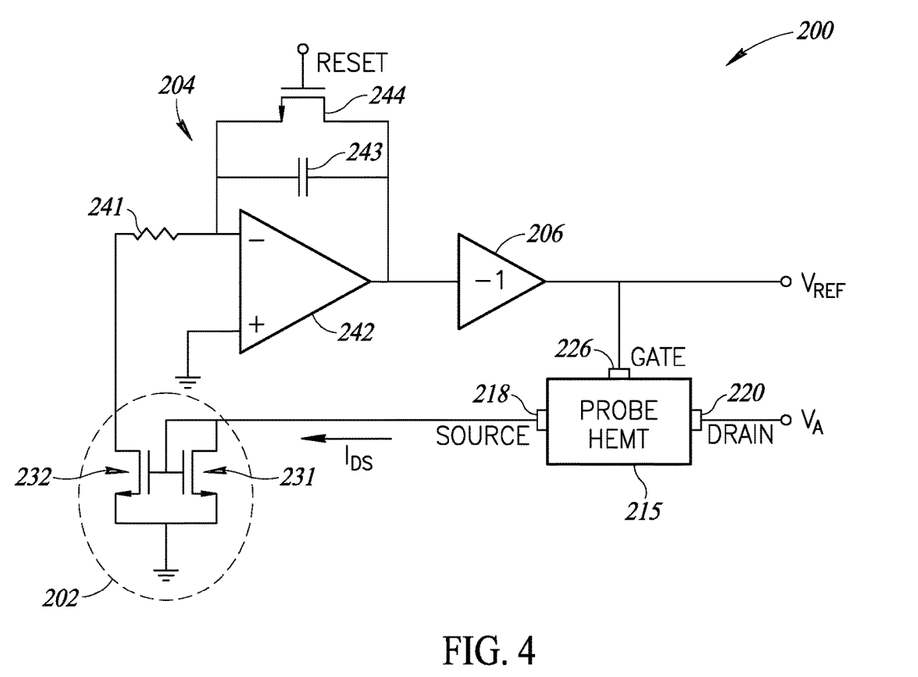
FIG. 4 is a schematic circuit diagram illustrating an isolation voltage supply circuit, in accordance with one or more embodiments of the present disclosure.

FIG. 4 is a schematic circuit diagram illustrating an isolation voltage supply circuit 200, in accordance with one or more embodiments of the present disclosure. The isolation voltage supply circuit 200 may generate a supply voltage $V_{REF}$ which may be applied to an isolation electrode. For example, the isolation voltage supply circuit 200 may be coupled to the isolation electrode 26 of the HEMT device 10 shown in FIGS. 1A and 1B, any of the first, second, and third isolation electrodes 126a, 126b, 126c of the device 110 shown in FIG. 3, or any other isolation electrode which may be utilized to interrupt a 2DEG layer and electrically isolate one or more HEMT devices or any 2DEG devices that use 2DEG layer 16.

As shown in FIG. 4, the isolation voltage supply circuit 200 may include a current mirror 202, an integrator 204, a gain stage 206 and a probe HEMT 215. The isolation voltage supply circuit 200 may generate the supply voltage $V_{REF}$ based on a current through a probe HEMT 215.

The gate of the probe HEMT 215 is electrically connected to an isolation electrode 226. In some embodiments, the probe HEMT 215 straddles the isolation electrode 226, with the isolation electrode 226 serving as the gate of the probe HEMT 215, and the source and drain contacts 218, 220 separated laterally from one another by the isolation electrode 226.

The source contact 218 of the probe HEMT 215 is electrically coupled to an input of the current mirror 202, which receives as input a drain-to-source current $I_{DS}$ of the probe HEMT 215. The current mirror 202 includes a current sensor 231 and a current generator 232. The current sensor 231 and the current generator 232 may each include a respective transistor, which may be any transistor, including for example a MOSFET transistor as shown in FIG. 4. The gate terminals of the current sensor 231 and the current generator 232 may be electrically coupled to one another, and the source terminals of the current sensor 231 and the current generator 232 may be electrically coupled to one another and to an electrical ground. The drain and gate terminals of the current sensor 231 may be coupled to each other and may receive the drain-to-source current $I_{DS}$ of the probe HEMT 215.

The current generator 232 is electrically coupled to the integrator 204. The current generator 232 generates a mirrored current based on the drain-to-source current $I_{DS}$ of the probe HEMT 215 input to the current sensor 231, and the current generated by the current generator 232 is provided as input to the integrator 204.

The integrator 204 may be, for example, a current integrator which integrates the input current over time. The integrator 204 may include an input resistor 241 coupled between the current generator 232 and an inverting input of an operational amplifier 242. The integrator 204 further includes a capacitor 243 coupled between an output of the op amp 242 and the inverting input. The non-inverting input of the op amp 242 may be coupled to ground. A reset switch 244, which may be any transistor, such as a MOSFET, is coupled in parallel with the capacitor 243 between the inverting input and the output of the op amp 242.

The gain stage 206 may be a −1 gain stage. That is, the output of the gain stage 206 may be inverted with respect to the input, which may result in a positive voltage being output from the gain stage 206. The output of the gain stage 206 is the supply voltage $V_{REF}$ which is applied to the isolation electrode 226 and which electrically isolates one or more HEMT devices from one another, such as HEMT devices that are disposed adjacent to opposite sides of the isolation electrode 226. That is, the supply voltage $V_{REF}$ is a voltage sufficient to pinch off or otherwise interrupt the 2DEG layer underlying the isolation electrode 226.

In operation, a voltage $V_A$ is applied to the drain contact 220 of the probe HEMT 215, which causes a current from the drain contact 220 to the source contact 218 (e.g., through the 2DEG layer) of the probe HEMT 215. The voltage $V_A$ may be a fixed voltage that is applied to the drain contact 220 of the probe HEMT 215, for example, to generate a particular drain-to-source current $I_{DS}$ through the probe HEMT 215.

The current sensor 231 senses the drain-to-source current $I_{DS}$ and the current generator 232 generates a mirrored current which charges the integrator 204. The output of the integrator 204, and thus the output supply voltage $V_{REF}$, gradually increases in magnitude until the supply voltage $V_{REF}$ becomes large enough to inhibit conduction between the drain and source of the probe HEMT 215. In this condition, the current sensor 231 prevents the integrator 204 from further charging through the current mirror 202, since the drain-to-source current $I_{DS}$ is effectively zero. The capacitor 243 of the integrator 204 holds the pinch-off voltage for the isolation electrode 226 (i.e., the voltage at which the isolation electrode 226 fully interrupts the underlying 2DEG layer so that the drain-to-source current $I_{DS}$ is zero or very close to zero).

The isolation electrode 226 may receive the supply voltage $V_{REF}$ for any period of time, thereby maintaining the interruption of the underlying 2DEG layer and electrically isolating one or more HEMT devices from one another. In some embodiments, the isolation electrode 226 may receive the supply voltage $V_{REF}$ until the supply voltage is reset via the reset switch 244. In some embodiments, the control terminal (e.g., the gate) of the reset switch 244 may be electrically coupled to processing circuitry, such as a microcontroller or the like, which may selectively control resetting of the isolation voltage supply circuit 200, and may thus selectively control application of the supply voltage $V_{REF}$ to the isolation electrode 226.

Since the isolation voltage supply circuit 200 generates the supply voltage $V_{REF}$ based on the current through the probe HEMT 215 upon application of a particular, known voltage $V_A$, the degree of isolation or interruption of the underlying 2DEG layer (e.g., a depth of the space charge region generated beneath the isolation electrode 226) may be set as desired, which may be set at different levels in various embodiments. Moreover, the isolation voltage supply circuit 200 may be sufficient to interrupt the 2DEG layer in HEMT devices having various different sizes, dimensions, or geometries, including, for example, HEMT devices having various different thickness of the heterostructure and 2DEG layer.

In some embodiments, a plurality of isolation voltage supply circuits 200 may be included in a device, with each of the isolation voltage supply circuits providing a separate supply voltage. For example, referring again to FIG. 3, the device 110 may include three isolation supply voltage circuits 200 which respectively generate and provide the first, second, and third supply voltages $V_1$, $V_2$, $V_3$ to the first, second, and third isolation electrodes 126a, 126b, 126c.

Figure 5A:
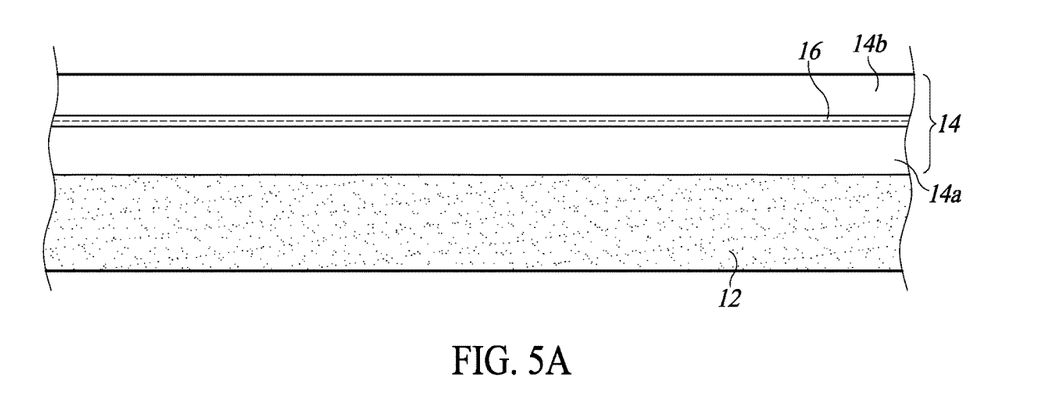
FIGS. 5A through 5C are cross-sectional views illustrating a method of fabricating a 2DEG-confined HEMT device, in accordance with one or more embodiments of the present disclosure.
Figure 5B:
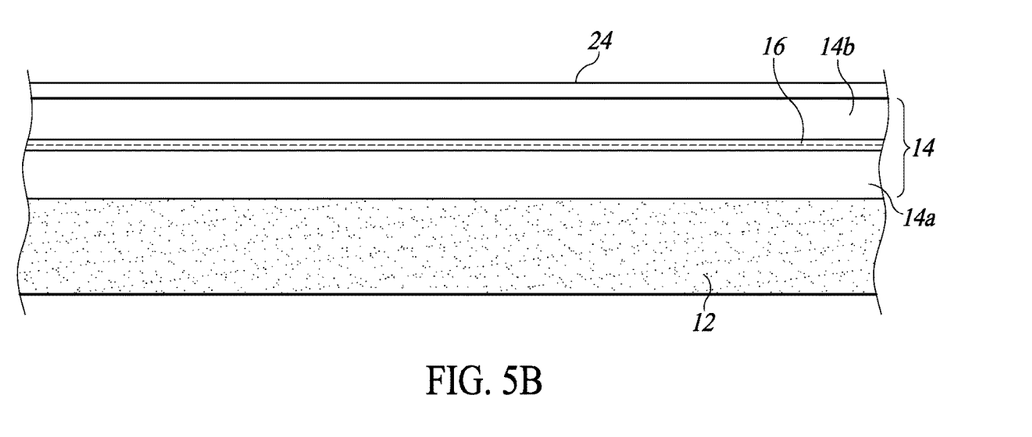
Figure 5C:
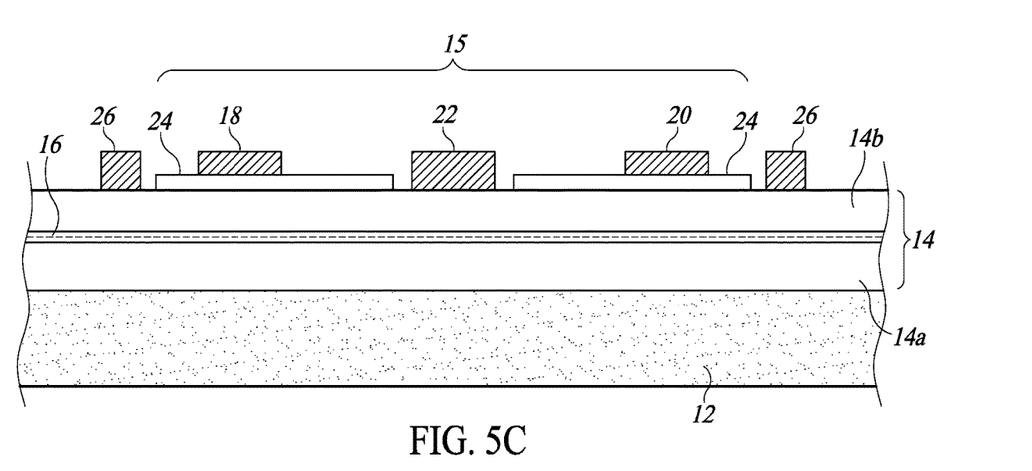

FIGS. 5A-5C are cross-sectional views illustrating a method of fabricating a 2DEG-confined HEMT device, in accordance with one or more embodiments. The illustrated method may be used, for example, to fabricate the HEMT device 10 shown and described with respect to FIGS. 1A and 1B, although embodiments are not limited thereto.

As shown in FIG. 5A, a heterostructure 14 is formed on a substrate 12. The substrate 12 may be any semiconductor substrate, and may include, for example, silicon (Si), silicon carbide (SiC), aluminum oxide ($Al_2O_3$) or any other suitable substrate. In some embodiments, the substrate 12 may be or include semi-insulating gallium arsenide (GaAs).

The heterostructure 14 may be formed on the substrate 12 by any suitable process, including for example by deposition of two semiconductor layers, such as compound semiconductor layers, to form the heterostructure 14 having the first layer 14a, the second layer 14b, and a heterojunction between the first and second layers 14a, 14b that provides or operably forms the 2DEG layer 16.

In some embodiments, a buffer layer may be formed between the substrate 12 and the heterostructure 14. For example, a buffer layer including $SiO_2$, SiC, or any other semiconductor material may be grown or deposited on the substrate 12 using a conventional method such as thermal oxidation or the like.

In some embodiments, the first layer 14a may be or include a layer of an intrinsic semiconductor, e.g., undoped gallium arsenide (GaAs) or gallium nitride (GaN). The first layer 14a can be sequentially grown using an epitaxial deposition method such as, for example, metal-organic vapor phase epitaxy (MOVPE).

The second layer 14b may be grown on the first layer 14a using any suitable method such as any conventional methods known in the art of HEMT device processing. In some embodiments, the second layer 14b may be or include a layer of a negatively-doped semiconductor, e.g., negatively-doped aluminum gallium arsenide ($Al_xGa_{1-x}As$) or negatively-doped gallium nitride (GaN).

As shown in FIG. 5B, a capping layer 24 may be formed overlying the second layer 14b of the heterostructure 14. The capping layer 24 may be a layer of negatively-doped semiconductor material. In some embodiments, the capping layer 24 may be a negatively-doped layer of a same semiconductor material as the first layer 14a. For example, in embodiments in which the first layer 14a is a layer of undoped GaAs or undoped GaN, the capping layer 24 may be a layer of negative-doped GaAs or negatively-doped GaN, respectively.

In some embodiments, the capping layer 24 may be formed as a continuous layer overlying or completely overlapping the entire heterostructure 14. In some embodiments, the capping layer 24 may be formed as a discontinuous or patterned layer having a plurality of regions which respectively overly regions of the heterostructure 14 where one or more HEMTs will be formed.

As shown in FIG. 5C, a HEMT 15 is formed including source and drain contacts 18, 20 and a gate 22, and an isolation electrode 26 is formed at least partially surrounding the HEMT 15. The gate 22 and the isolation electrode 26 may be recessed with respect to the source and drain contacts 18, 20, as shown. The method may include forming recesses in the capping layer 24. In some embodiments, recesses are formed through the capping layer 24 for both the gate 22 and the isolation electrode 26. In other embodiments, for example where the capping layer 24 is formed as a discontinuous layer, regions where the isolation electrode 26 are later formed may already be exposed since the capping layer 24 may not have been previously formed in those regions.

The recesses in the capping layer 24 may be formed by selectively removing portions of the capping layer 24. In some embodiments, the recesses may be formed using conventional patterning methods such as optical lithography and either dry plasma etching or wet chemical etching, or combinations thereof. The recesses may be formed to have any shape as may be desired, depending, for example, on a particular circuit layout.

The gate 22 and the isolation electrode 26 may be formed of any conductive materials, including, for example, polysilicon. In some embodiments, the gate 22 and the isolation electrode 26 are formed on a same layer, and in a same process, as one another. For example, the gate 22 and the isolation electrode 26 may be formed of polysilicon in a same deposition process, which may be any conventional deposition process such as low-pressure chemical vapor deposition (LPCVD), plasma-enhanced chemical vapor deposition (PECVD), or the like. The gate 22 and the isolation electrode 26 may be formed directly on the heterostructure 14, such as on a surface of the second layer 14b that is exposed through the recesses in the capping layer 24.

While the method illustrated in FIGS. 5A-5C shows the formation of a single HEMT 15 that is at least partially surrounded by an isolation electrode 26, embodiments provided herein are not limited thereto. For example, the method illustrated in FIGS. 5A-5C may be utilized to form a device including any number of HEMTs 15 and any number of isolation electrodes 26 having any shape as may be desired, depending, for example, on a particular circuit layout.

The various embodiments provided herein facilitate selective isolation of HEMTs or any device using a 2DEG layer by utilizing one or more isolation electrodes to selectively interrupt an underlying 2DEG layer, thereby confining the 2DEG layer based on the geometry of the one or more isolation electrodes. The isolation electrodes, when applied with a suitable voltage, may define a boundary of the 2DEG layer and may thus electrically isolate one or more HEMTs from one or more neighboring HEMTs which are separated by the isolation electrodes.

Embodiments of the present disclosure may therefore provide electrical isolation between neighboring HEMTs which can be utilized to avoid unwanted crosstalk. Moreover, embodiments of the present disclosure can selectively provide electrical isolation between neighboring HEMTs in a reversible way. For example, the neighboring HEMTs can be electrically isolated from one another by application of a suitable voltage to an isolation electrode which interrupts the underlying 2DEG layer; however, by decoupling or removing the applied voltage from the isolation electrode, the 2DEG layer may again be continuous between the neighboring HEMTs. This allows, for example, cross-communication between neighboring HEMTs when such communication may be desirable, and further allows electrical isolation between the neighboring HEMTs when isolation may be desirable.

The various embodiments provided herein may facilitate electrical isolation between HEMT devices or any device using a 2DEG layer without the use of isolation trenches, such as isolation trenches that are permanently formed in a semiconductor structure and filled with an isolation material. Moreover, it is noted that embodiments provided herein may be formed with fewer process steps than would be utilized to form, for example, isolation trenches surrounding or partially surrounding one or more HEMTs. Indeed, in some embodiments, an isolation electrode and a gate of a HEMT may be formed in a same process, so that the formation of the isolation electrode does not add complexity to an overall process of manufacturing such HEMT devices.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a heterostructure on the substrate, the heterostructure including a first semiconductor layer on the substrate, a second semiconductor layer on the first semiconductor layer, and a two-dimensional electrode gas (2DEG) layer between the first and second semiconductor layers;
   a first 2DEG device having a conduction channel in the 2DEG layer; and
   an isolation electrode overlying the heterostructure and at least partially surrounding a periphery of the first 2DEG device, the isolation electrode, in use, interrupts the 2DEG layer in response to an applied voltage.

2. The device of claim 1 wherein the isolation electrode completely surrounds the periphery of the first 2DEG device.

3. The device of claim 1 wherein the isolation electrode extends lengthwise in a direction transverse to a channel direction of the first 2DEG device.

4. The device of claim 1 wherein the first 2DEG device comprises a high electron mobility transistor (HEMT), the HEMT including:
   source and drain contacts on the heterostructure and electrically coupled to the second semiconductor layer; and
   a gate on the heterostructure, the gate, in use, controls an electrical current between the source and drain contacts through the 2DEG layer.

5. The device of claim 4 wherein at least one of the isolation electrode or the gate of the HEMT is recessed with respect to the source and drain contacts of the HEMT.

6. The device of claim 4 wherein the isolation electrode and the gate of the HEMT are disposed directly on the second semiconductor layer.

7. The device of claim 1, further comprising an isolation voltage supply circuit electrically coupled to the isolation electrode, the isolation voltage supply circuit, in use, generates the applied voltage.

8. The device of claim 7 wherein the isolation supply circuit includes a probe HEMT, the probe HEMT including:
   source and drain contacts on the heterostructure and separated laterally from one another by the isolation electrode; and
   a gate electrically connected to the isolation electrode,
   wherein the isolation voltage supply circuit generates the applied voltage based on a current between the source and drain contacts of the probe HEMT in response to a fixed voltage applied to the drain contact.

9. The device of claim 8 wherein the isolation supply circuit further includes:
   a current mirror including a current sensor and a current generator, the current sensor electrically coupled to the source contact of the probe HEMT;
   an integrator having a first input coupled to the current generator, a second input coupled to an electrical ground, and an output coupled to the isolation electrode.

10. The device of claim 9 wherein the isolation supply circuit further includes:
    a gain stage electrically coupled between the output of the integrator and the isolation electrode; and
    a reset switch electrically coupled between the first input and the output of the integrator.

11. The device of claim 1, further comprising
    a second 2DEG device adjacent to the first 2DEG device, wherein the isolation electrode is positioned between the first and second 2DEG devices.

12. A device, comprising:
    a substrate;
    a heterostructure on the substrate, the heterostructure including a first semiconductor layer on the substrate, a second semiconductor layer on the first semiconductor layer, and a two-dimensional electrode gas (2DEG) layer between the first and second semiconductor layers;
    a conduction channel in the 2DEG layer;
    source and drain contacts on the heterostructure;
    a gate on the heterostructure and disposed between the source and drain contacts; and
    an isolation electrode on the heterostructure and at least partially surrounding the source contact, the drain contact, and the gate.

13. The device of claim 12, further comprising an isolation voltage supply circuit electrically coupled to the isolation electrode, the isolation electrode configured to interrupt the 2DEG layer in response to a voltage supplied from the isolation voltage supply circuit.

14. The device of claim 12 wherein the isolation electrode and the gate are disposed directly on the second semiconductor layer.

\* \* \* \* \*